United States Patent [19]

Fujisawa et al.

[11] Patent Number: 4,694,748

[45] Date of Patent: Sep. 22, 1987

[54] DEVICE FOR MOVING OFFSET PLATES

[75] Inventors: Kunio Fujisawa, Saitama; Toyoji Tanaka, Tokyo; Toshio Mochizuki, Saitama; Norio Nakamura, Saitama; Seiji Kaya, Saitama, all of Japan

[73] Assignee: Fujirex Company, Limited, Japan

[21] Appl. No.: 798,179

[22] Filed: Nov. 14, 1985

[51] Int. Cl.$^4$ ............................................. B41C 1/02
[52] U.S. Cl. ........................... 101/401.1; 271/18.3; 271/268; 271/277; 355/14 SH; 430/49
[58] Field of Search ................... 101/369, 47, 401.1; 271/268, 277, 18.3, 5; 355/14 SH; 430/48–49, 124

[56] References Cited

U.S. PATENT DOCUMENTS

| | | | |
|---|---|---|---|
| 3,111,084 | 11/1963 | Rudenour et al. | 101/47 |
| 3,817,171 | 6/1974 | Ernst, Jr. | 101/47 |
| 3,827,803 | 8/1974 | Shelffo et al. | 271/277 |
| 3,854,715 | 12/1974 | Coleman | 271/277 |
| 3,906,512 | 9/1975 | Farlow | 271/277 |
| 3,918,707 | 11/1975 | Villemer et al. | 271/277 |
| 4,155,545 | 5/1979 | Yanagawa | 271/277 |

FOREIGN PATENT DOCUMENTS

| | | | |
|---|---|---|---|
| 57765 | 5/1979 | Japan | 271/277 |
| 137246 | 8/1982 | Japan | 271/277 |
| 2112359 | 7/1983 | United Kingdom | 271/277 |
| 419456 | 8/1974 | U.S.S.R. | 271/277 |

Primary Examiner—E. H. Eickholt
Attorney, Agent, or Firm—Ostrolenk, Faber, Gerb & Soffen

[57] ABSTRACT

A device for moving offset plates from a stack of such plates to a fixing device by grasping a plurality of offset plates having positioning engagement holes from a stack and moving them through a print-through device to a fixing device utilizing a transport mechanism having positioning pins to receive the engagement holes of the offset plates and to release them when the offset plates have completed the desired movement.

8 Claims, 5 Drawing Figures

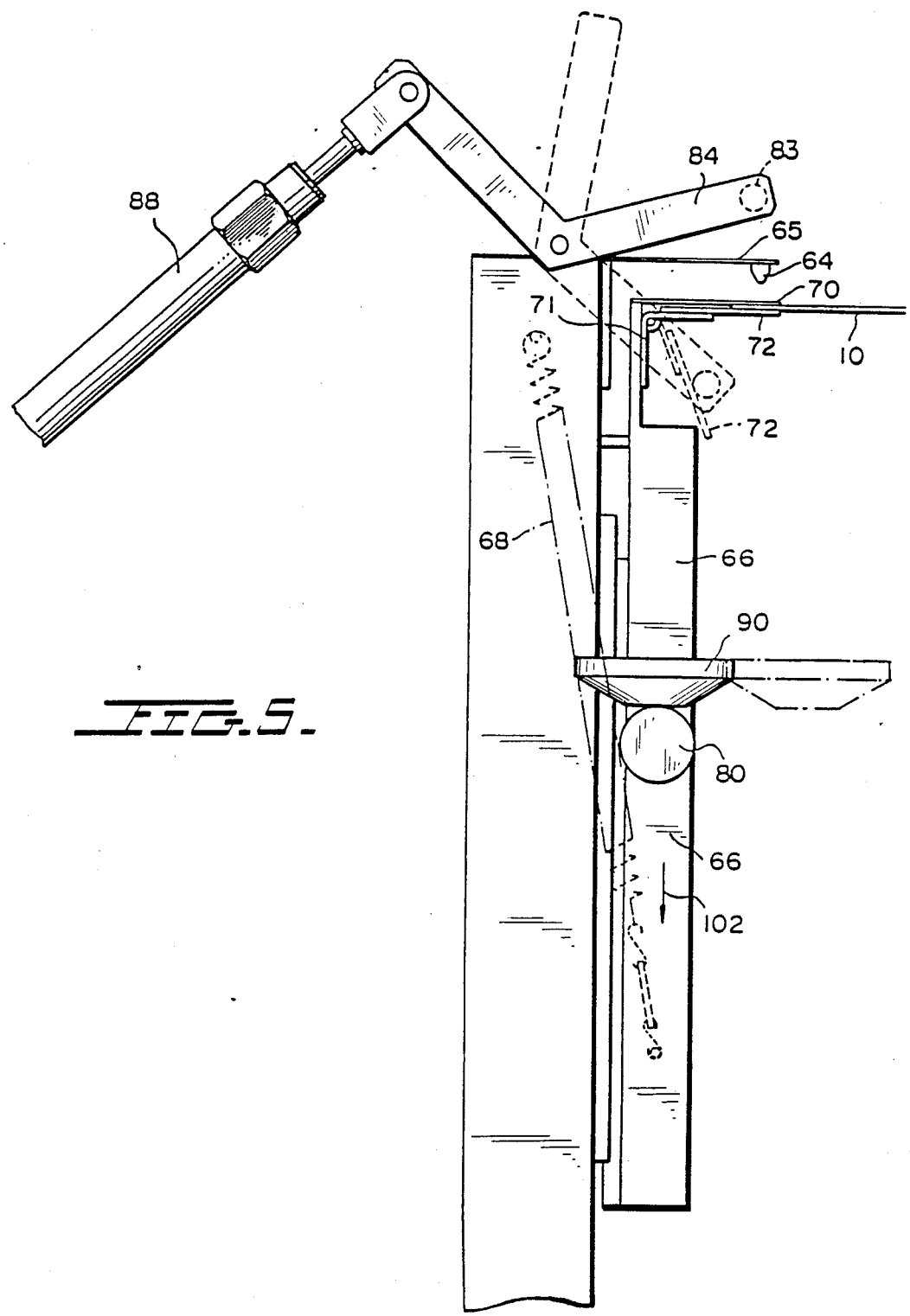

DEVICE FOR MOVING OFFSET PLATES

BACKGROUND OF THE INVENTION

1. Field of the Invention

The present invention relates to a device for moving offset plates and specifically to shift offset plates to a fixing device by grasping a plurality of offset plates equipped with positioning engagement holes as they are piled up in a stack and moving them to a fixing device through a print-through device.

2. Prior Art

Various devices are known for movement of offset plates such as aluminum base plates, zinc oxide masters, zinc plates and OPC plates, and others which have been given an anodic oxidation treatment. Offset plates are provided with a plurality of positioning engagement holes at the edge. The positioning holes are pushed onto positioning pins of a forwarding device by means of the engagement device, thereby causing the shifting device to hold the offset plate.

In the case where an object is grasped by grasping means to be moved to a prescribed location, it is ordinarily and practically impossible to move the same accurately to a prescribed location due to the manufacturing error and necessary tolerances for the parts of the grasping means. In conventional apparatus, the positioning holes are loaded on the pins in a condition in which their positions are not completely coordinated. This has the effect of producing wrinkles or destroying the positioning holes.

In addition, the offset plate after the completion of print-through does not have a natural fall from any positioning pin that has been forcefully pushed in, with a result that it is difficult for the offset plate to be dropped from the positioning pin at a prescribed time.

OBJECT OF THE INVENTION

The present invention resulted from attempts to solve the various problems of the conventional moving device as described above. The present invention provides a moving device which is capable of interrelating the positioning pin and the positioning holes into the most optimal positional relationship with each other, thereby facilitating engagement and disengagement between the two.

Another purpose of this invention lies in providing a moving device which is capable of easily removing the offset plate from the positioning pins at the time when the offset plate has arrived at a prescribed position, thereby dropping the same accurately.

SUMMARY OF THE INVENTION

In order to achieve the foregoing objects, this invention comprises apparatus for moving the offset plate. A plurality of offset plates are equipped with engagement holes piled up in a stack. The plates are grasped and passed through a print-through device to be further forwarded to a fixing device. The apparatus is so constructed that the offset plates in the stack are engaged one by one and elevated, shifted and dropped at a prescribed location. The apparatus comprises, in addition, a frame mechanism which rotates adjacent the aforementioned stack, a print-through device and a fixing device. As the tip portion of the frame rotates, a pin-equipped fixing plate is oriented with its tangential direction faced to the tip portion of the frame mechanism. A removing plate having a hole for engagement with the aforementioned pin is mounted on a slideable member. The slideable member is freely slideable radially on the aforementioned frame mechanism. The slideable member is biased toward the fixing plate at all times. A holding plate is hinged to the region of mounting of the removal plate of the slideable member. The holding plate is ordinarily biased in a direction to push the removal plate. The engagement device is therefore pushed by the holding plate, a space just after it has disengaged the engagement hole and pin, onto the removal plate. The offset plate is then sent to the print-through device. The holding plate after the completion of print-through is raised and further elevated from the fixing plate, with a result that it is removed from the carrying device and forwarded to the fixing device.

BRIEF DESCRIPTION OF THE DRAWINGS

The foregoing and other objects of the invention will become apparent in the following description and drawings in which:

FIG. 5 is a view corresponding to the front of FIGS. 3 and 4 showing the offset plate being removed from the offset carrying device after print-through.

DETAILED DESCRIPTION OF THE PREFERRED EMBODIMENTS

Figure 1:
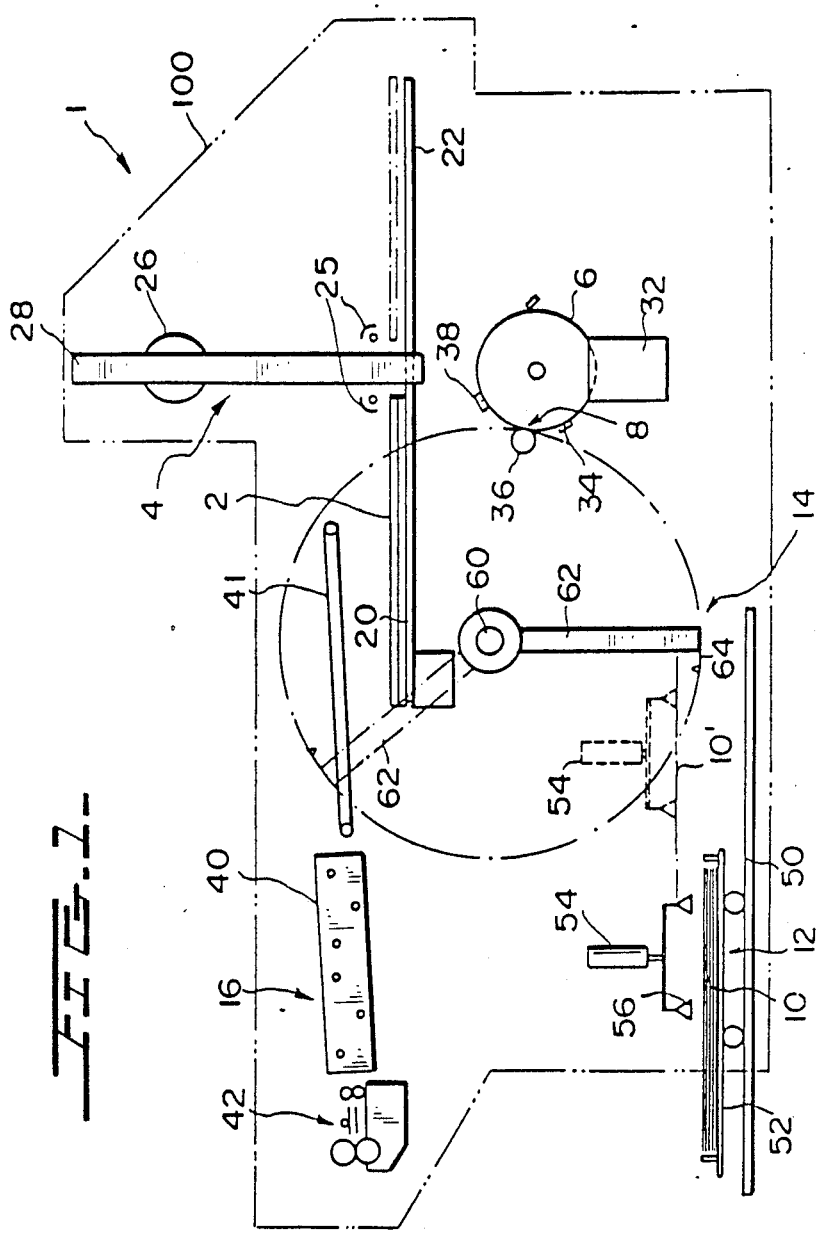
FIG. 1 is a side view, partly schematic, of an offset plate making apparatus embodying the present invention.

Referring to the drawings, the offset plate making apparatus 1 includes the following major parts which are later described in detail but have been above referred to:

the projection part 4;
the drum 6;
the print-through part 8;
the offset plate 10;
the fixing part 16;
the projection lens 26;
the developing device 32; and
the housing 100.

Figure 2:
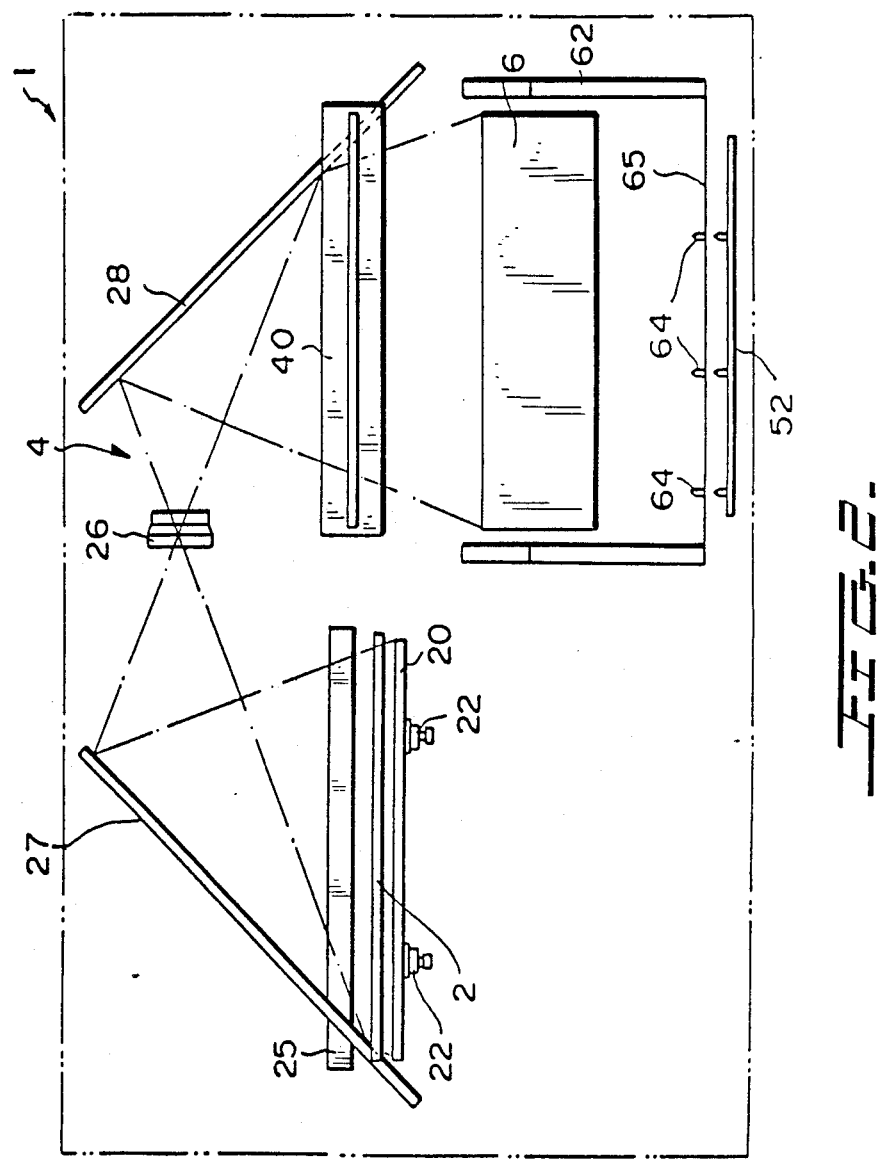
FIG. 2 is a front view of the apparatus of FIG. 1.

As is shown in FIGS. 1 and 2, the offset plate making device comprises a projection part 4 which scans and projects a manuscript 2, a print-through part 8 which receives the manuscript image on a drum 6 and prints it through on the offset plate, a stack-holding part 12 which accumulates the offset plates 10, an offset plate carrying part 14 and a fixing part 16 for fixing the through-printed offset plate 10.

The projection part 4 moves the receiving stand 20 of the manuscript 2 on a rail 22. A part of the manuscript is illuminated by an illuminating device 25 and the illuminated part is projected onto the drum 6 by means of the first mirror 27, projection lens 26 and the second mirror 28.

Around the drum 6, there are provided a developing device 32, a preliminary charging device 34, a print-through roller 36 and a charging device 38. A light-receiving layer is formed on the surface of the drum 6 and is rotated on a continuous basis in a clockwise direction with respect to FIG. 1.

As a manuscript image is projected onto a light-receiving layer which has been charged by a charging device 38, an electron image is formed and it is then given a developing treatment by using a developing device 32. After it has further been given a preliminary charge by the preliminary charging device 34, the offset plate 10 is compressed to the light-receiving layer subsequent to development by means of a print-through roller 36, with a result that print-through is effected on the offset plate 10.

The offset plate 10 on which print-through has been effected is forwarded to a fixing part 16 by the plate-carrying part 14 which will be described in detail below. After the plate has been fixed at the fixing layer 40, gumming is effected by using a gummer 42 and drying is carried out before the plate is delivered out of the housing 100.

The offset plates 10 are piled up on a plate stand 52 which moves on the rail 50 of the stacker 12 and they are raised as they are adsorbed one by one by the adsorptive disk 56 which is regulated by a cylinder 54 to be sent to the print-through initiation position which is indicated by 10'.

Figure 3:
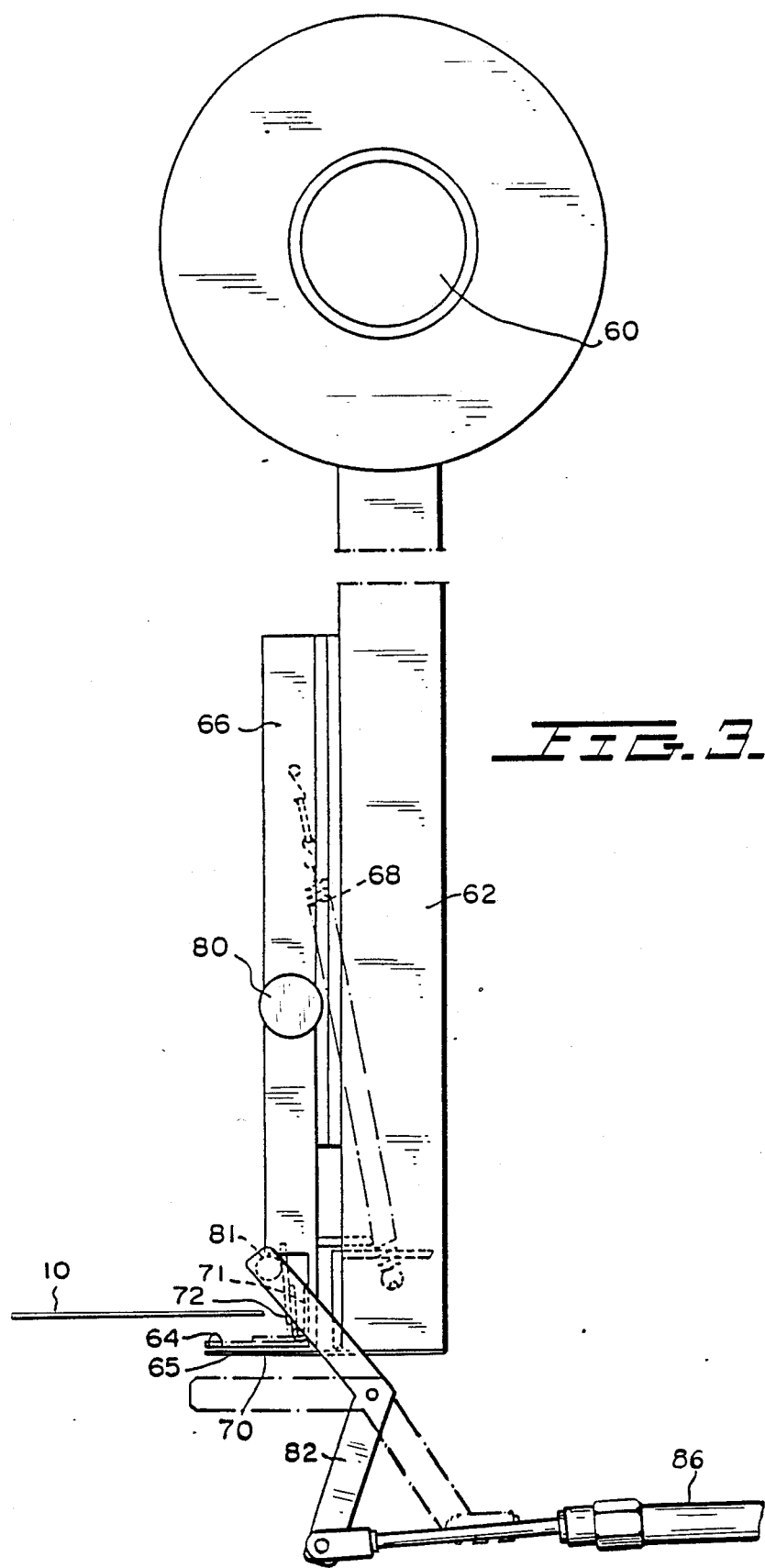
FIG. 3 is a schematic view showing the portion of the apparatus of FIG. 1 which is intended to grasp the offset plate in position where it is ready to do so.

As is shown in FIGS. 3 and 5, the offset plate transporting part 14 has a frame mechanism 62 which rotates in a counterclockwise direction with respect to the Figs. as it is journaled on an axis 60. The frame mechanism 62 is installed in such a manner as to be in parallel with the axis 60 and in direct crossing with the frame mechanism 62. At the tip of the frame mechanism 62, there is installed a fixing plate 65 on which three tapered pins 64 have been planted.

In the frame mechanism 62, a sliding member 66 is installed in such a manner as to be freely sliding as it is biased in a radially outward direction by a tension spring 68. At the tip of the sliding member 66, there is provided a removal plate 70 in parallel with the fixing plate 65.

At the part where the removal plate 70 and the frame mechanism 62 cross each other at the tip of the sliding member 66, there is provided a holding plate 72 which has been given strength or bias in a counterclockwise direction with respect to FIG. 3 by a spring-equipped hinge 71.

In addition, the holding plate 72 sticks out further than the fixing plate 66 and the removal plate 70 on one side of the apparatus 1. The sliding member 66 has a protrusion member 80 which sticks out of the plane of the frame mechanism 62.

On the main body (not shown) of the apparatus 1, arm members 82 and 84 are equipped with protrusions 81 and 83. The cylinders 86 and 88 are provided for the purpose of rotating the holding plate 72 in a clockwise direction in opposition to the intensifying strength of the spring-equipped hinge 71 at the time when the frame mechanism 62 is at the position which is indicated by the solid line in FIG. 1 that holds the offset plate 10 at the position which is indicated by the dotted line in FIG. 1 for the removal of the offset plate 10.

On the main body (not shown) of the apparatus 1, there is also provided a cam member 90 for the separation of the offset plate 10 from the pin 64 by sliding the sliding member 66 in opposition to the intensification force of the tension spring 68 at the time when the frame mechanism 62 is at a location for the removal of the offset plate 10 as is shown in FIG. 5.

In the upper portion of the rotary range of the frame mechanism 62, moreover, there is provided a conveyer 41 for forwarding the offset plate 10 to the fixing part 16 after print-through as is shown in FIG. 1.

The action of the offset carrying part 14 which is constructed as described above is explained below: First, the frame mechanism 62 stops at the position which is indicated by a solid line in FIG. 1. As is shown in FIG. 3, a cylinder 86 extends, the arm member 82 rotates in a clockwise direction and the protrusion 81 raises the holding plate 72. Next, the topmost of the offset plates 10 which have been piled up on the plate stand 52 is grasped by an engagement disc 56, the cylinder 54 is moved from the position which is indicated by the solid line to the position which is indicated by the dotted line in FIG. 1 by means of a forwarding device (which is not shown in the drawing) and the pins 64 have been approximately made to coincide with the holes in plate 10 (the engagement hole being provided at the tip of the offset plate 10), the engagement disc 56 stops engaging and drops the offset plate 10 onto the pin 64.

Even if there is some misalignment in position in this case between the engagement hole of the offset plate 10 and the pin 64, the offset plate 10 will settle at the optimal position as it falls while it is being guided by the pin 64 which has a tapered shape.

Figure 4:
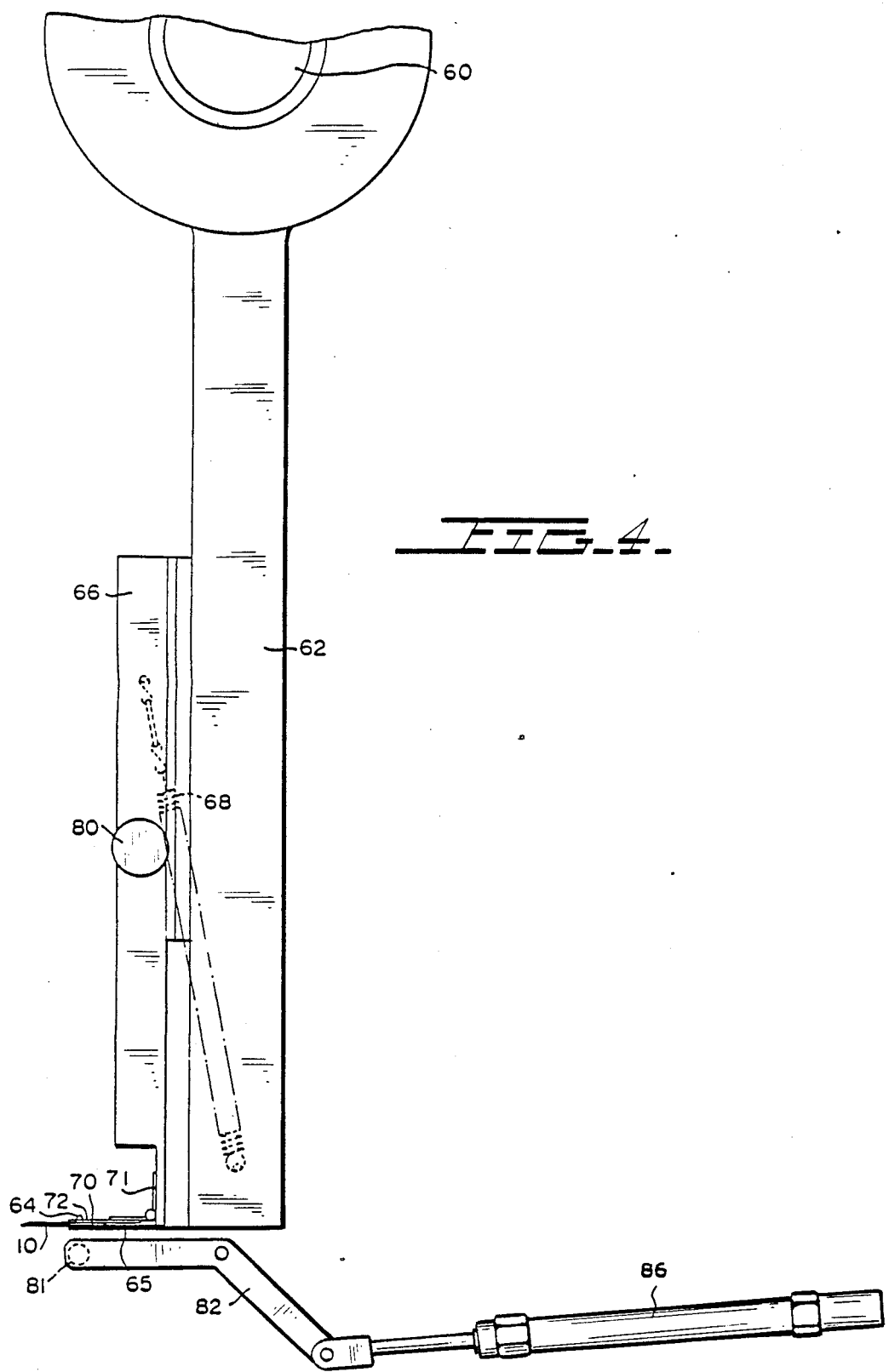
FIG. 4 is a view corresponding to that of FIG. 3 showing the offset plate being grasped.

As is shown in FIG. 4, the cylinder 86 is then shortened, the arm member 82 rotates in a counterclockwise direction and grasps the offset plate 10 that has been engaged with the pin 64 by means of removal plate 70 and a holding plate 72.

Thereafter, the frame mechanism 62 rotates in a counterclockwise direction in FIG. 1 and moves the offset plate 10. The print-through roller 36 is ordinarily removed from the drum 30. When the tip of the offset plate 10 passes between the two, the print-through roller 36 is pressed against the drum 30 by an operating device which is not shown in the drawing.

The frame mechanism 62 stops after it has moved the offset plate 10 after print-through to a position above the conveyer 41. The cam member 90 moves and, at the time when it reaches the position which is indicated by a solid line in FIG. 5, the slideable member 66 is moved in the direction of arrow 102 through a protuberant member 80, separates the removal plate 70 from the fixing plate 65. As is shown in FIG. 5, a cylinder 88 extends, the arm member 84 rotates in the clockwise direction, the arm member 84 moves to the neighborhood of the position which is indicated by a dotted line and opens the holding plate 72.

As a result of the above, the engagement between the engagement hole of the offset plate 10 and the pin 64 is released, with a result that the offset plate 10 falls into the conveyer 41. As a consequence of this, the offset plate 10 is sent to the fixing part 16 by means of a conveyer 41, where fixing, gumming and drying are carried out and it is sent out of the housing 100.

Since, according to this invention, the offset plate is moved and through-printed as it is grasped by maintaining the optimal positional relationship with the pin of the carrying device, there will be no possibility of wrinkles being produced on the offset plate or the engagement hole being broken, thereby causing a positional shift. Accordingly, it becomes possible to obtain an image of high quality.

In addition, the offset plate after print-through is easily removed from the carrying device and sent to a fixing device, with a result that a series of plate-making cycles are conducted smoothly.

The present invention has been described in connection with preferred embodiments thereof. Since many variations and modifications will now become apparent to those skilled in the art, it is preferred that the present invention be limited not by the specific disclosure herein, but only by the appended claims.

What is claimed is:

1. Printing and fixing apparatus for forming an image on offset plates comprising a support for a stack of said offset plates, a photo-printing device and a photo-fixing device; said offset plates initially having no discernible image when in said stack;

said apparatus being operable in connection with offset plates having a plurality of holes adjacent one edge thereof; said offset plates forming said stack and being arranged with the holes in said plates aligned with each other;

operating means for moving said plates in a cycle of operation individually and successively from said stack to said photo-printing device and then to said photo-fixing device;

said operating means comprising a transport member; one end of said transport member being translatable in a rotary path from said stack to said photo printing device to said photo-fixing device; said photo-printing device and said photo-fixing device forming a discernible image on each plate;

additional means for engaging and raising the top offset plate of said stack towards said transport member;

a pin fixing plate carried tangentially at the one end of said transport member and having a plurality of pins registrable with the holes in the plate which has been raised by said additional means; and means for disengaging the plate from the pins and the transport member on completion of a cycle of operation.

2. The apparatus of claim 1 also having a tripper plate, said tripper plate being movable between a position where it is in contact with the offset plates and one where it is disengaged from said offset plates; a slideable member engaging and supporting said tripper plate; said slideable member being slideably carried by said transport member and means biasing said slideable member radially outwardly of said transport member.

3. The apparatus of claim 2 having a fixing plate; said tripper plate being pressed against said fixing plate by said slideable member.

4. Printing and fixing apparatus for forming an image on offset plates comprising a support for a stack of said offset plates, a photo-printing device and a photo-fixing device; said offset plates initially having no discernible image when in said stack;

said apparatus being operable in connection with offset plates having a plurality of holes adjacent one edge thereof; said offset plates forming said stack and being arranged with the holes in said plates aligned with each other;

operating means for moving said plates in a cycle of operation individually and successively from said stack to said photo-printing device and then to said photo-fixing device;

said operating means comprising a transport member; one end of said transport member being translatable in a rotary path from said stack to said photo-printing device to said photo-fixing device; said photo-printing device and said photo-fixing device forming a discernible image on each plate;

additional means for engaging and raising the top offset plate of said stack towards said transport member;

a pin fixing plate carried tangentially at the one end of said transport member and having a plurality of pins registrable with the holes in the plate which has been raised by said additional means;

means for disengaging the plate from the pins and the transport member on completion of a cycle of operation;

a tripper plate, said tripper plate being movable between a position where it is in contact with the offset plates and one where it is disengaged from said offset plates; a slideable member engaging and supporting said tripper plate; said slideable member being slideably carried by said transport member and means biasing said slideable member radially outwardly of said transport member; and a fixing plate; said tripper plate being pressed against said fixing plate by said slideable member; also said tripper plate being provided with a hole for engagement with said pins.

5. The apparatus of claim 4 also having a holding plate hingedly mounted in the area of said slideable member and means for biasing said holding plate.

6. The apparatus of claim 5, wherein said holding plate has a hole for engagement with said pins.

7. The apparatus of claim 6, wherein said tripper plate is held by the holding plate after it has released an offset plate by causing the hole and pins to substantially coincide on the tripper plate.

8. The apparatus of claim 7, wherein the offset plate is then sent through the photo-printing device and the photo-fixing device and is removed by releasing the engagement between the holes and the pins.

* * * * *